US008420412B2

(12) United States Patent
Crofoot et al.

(10) Patent No.: US 8,420,412 B2
(45) Date of Patent: Apr. 16, 2013

(54) METHOD OF FORMING A PHOTOVOLTAIC CELL MODULE

(75) Inventors: Steven D. Crofoot, Freeland, MI (US); Kevin R. Houle, Midland, MI (US); David C. Johnson, Midland, MI (US); Barry M. Ketola, Freeland, MI (US)

(73) Assignee: Dow Corning Corporation, Midland, MI (US)

( * ) Notice: Subject to any disclaimer, the term of this patent is extended or adjusted under 35 U.S.C. 154(b) by 446 days.

(21) Appl. No.: 12/922,390

(22) PCT Filed: Mar. 13, 2009

(86) PCT No.: PCT/US2009/001621
§ 371 (c)(1), (2), (4) Date: Sep. 13, 2010

(87) PCT Pub. No.: WO2009/114189
PCT Pub. Date: Sep. 17, 2009

(65) Prior Publication Data
US 2011/0005066 A1    Jan. 13, 2011

Related U.S. Application Data

(60) Provisional application No. 61/036,752, filed on Mar. 14, 2008, provisional application No. 61/036,748, filed on Mar. 14, 2008, provisional application No. 61/146,551, filed on Jan. 22, 2009.

(51) Int. Cl.
*H01L 21/00*    (2006.01)

(52) U.S. Cl.
USPC .......................................................... 438/19

(58) Field of Classification Search ............... 438/19
See application file for complete search history.

(56) References Cited

U.S. PATENT DOCUMENTS

| 4,239,555 A | 12/1980 | Scharlack et al. |
| 4,340,709 A | 7/1982 | Jeram et al. |

(Continued)

FOREIGN PATENT DOCUMENTS

| DE | 3300622 A1 | 7/1984 |
| EP | 0528566 A1 | 2/1993 |

(Continued)

OTHER PUBLICATIONS

English language abstract for DE 3300622 extracted from espacenet.com database, dated Feb. 28, 2011, 11 pages.

(Continued)

*Primary Examiner* — William D Coleman
(74) *Attorney, Agent, or Firm* — Howard & Howard Attorneys PLLC

(57) ABSTRACT

A method of forming a photovoltaic cell module uses a cell press having a table and a plate that is spaced from and moveable relative to the table. The method includes supporting the cell with the plate between the plate and the table. A substrate and a tie layer disposed on the substrate are introduced between the cell and the table with the substrate supported by the table and with the tie layer facing the cell. One of the cell and the table are moved toward the other until the cell contacts the tie layer. A vacuum is applied between the cell and the tie layer to evacuate the space between the cell and the tie layer as the cell contacts the tie layer. This evacuation eliminates the possibility of air bubbles being formed between the cell and the tie layer as the cell contacts the tie layer.

22 Claims, 6 Drawing Sheets

U.S. PATENT DOCUMENTS

| | | | |
|---|---|---|---|
| 4,490,500 | A | 12/1984 | Smith |
| 4,686,137 | A | 8/1987 | Ward, Jr. et al. |
| 4,840,796 | A | 6/1989 | Sweet et al. |
| 5,145,933 | A | 9/1992 | Grisoni et al. |
| 5,593,532 | A | 1/1997 | Falk et al. |
| 5,651,837 | A | 7/1997 | Ohtsuka et al. |
| 6,020,409 | A | 2/2000 | Alvarez et al. |
| 6,134,784 | A | 10/2000 | Carrie et al. |
| 6,169,155 | B1 | 1/2001 | Alvarez et al. |
| 6,175,075 | B1 | 1/2001 | Shiotsuka et al. |
| 7,709,730 | B2 | 5/2010 | Johnson et al. |
| 2004/0214966 | A1 | 10/2004 | Tabei et al. |
| 2005/0167036 | A1 | 8/2005 | Yokoyama et al. |
| 2006/0207646 | A1 | 9/2006 | Terreau et al. |
| 2007/0265410 | A1 | 11/2007 | Loessel et al. |

FOREIGN PATENT DOCUMENTS

| | | | |
|---|---|---|---|
| EP | 0658943 | A1 | 6/1995 |
| EP | 0755080 | A2 | 1/1997 |
| EP | 1070734 | A2 | 1/2001 |
| EP | 1254192 | B1 | 11/2002 |
| JP | 2000-101119 | A | 4/2000 |
| JP | 2001-051284 | A | 2/2001 |
| JP | 2001-148488 | A | 5/2001 |
| WO | WO 94-29106 | A1 | 12/1994 |
| WO | WO 00-46817 | A1 | 8/2000 |
| WO | WO 03-093349 | A1 | 11/2003 |
| WO | WO 03-093369 | A1 | 11/2003 |
| WO | WO 2005-006451 | A1 | 1/2005 |
| WO | WO 2005-098522 | A1 | 10/2005 |
| WO | WO 2005-109489 | A1 | 11/2005 |
| WO | WO 2007-120197 | A2 | 10/2007 |
| WO | WO 2009-114190 | A2 | 9/2009 |

OTHER PUBLICATIONS

English language translation and abstract for JP 2000-101119 extracted from PAJ database, dated Mar. 1, 2011, 31 pages.

English language translation and abstract for JP 2001-051284 extracted from PAJ database, dated Mar. 1, 2011, 24 pages.

English language translation and abstract for JP 2001-148488 extracted from PAJ database, dated Mar. 1, 2011, 48 pages.

English language abstract for WO 94-29106 extracted from espacenet.com database, dated Mar. 1, 2011, 24 pages.

English language abstract for WO 2005-098522 extracted from espacenet.com database, dated Mar. 1, 2011, 24 pages.

English language abstract for WO 2005-109489 extracted from espacenet.com database, dated Mar. 1, 2011, 30 pages.

PCT International Search Report for PCT/US2009/001621, dated Nov. 3, 2009, 4 pages.

PCT International Search Report for PCT/US2009/001623, dated Jun. 16, 2010, 5 pages.

METHOD OF FORMING A PHOTOVOLTAIC CELL MODULE

CROSS-REFERENCE TO RELATED APPLICATIONS

The subject patent application claims priority to, and all the benefits of, International Patent Application No. PCT/US2009/001621, filed on Mar. 13, 2009, which claims priority to U.S. Provisional Patent Application Ser. Nos. 61/036,748 and 61/036,752, both filed on Mar. 14, 2008, and Provisional Patent Application Ser. No. 61/146,551 filed on Jan. 22, 2009. The entirety of these provisional patent applications is expressly incorporated herein by reference.

BACKGROUND OF THE INVENTION

1. Field of the Invention

The present invention generally relates to a cell press and a method of forming a photovoltaic cell module with the use of a cell press.

2. Description of the Related Art

Solar or photovoltaic cells are semiconductor devices used to convert light into electricity. In many applications, the photovoltaic cells are encapsulated to form photovoltaic cell modules (hereinafter referred to as "modules") to provide additional protection for the photovoltaic cell from environmental factors such as wind and rain. To date, however, encapsulation methods known in the art have been expensive and time consuming and, in many cases, ineffective.

The photovoltaic cells are typically encapsulated with the use of a cell press. The photovoltaic cell and a substrate with a tie layer disposed on the substrate are placed in the cell press. The cell press contacts the photovoltaic cell with the tie layer to encapsulate the photovoltaic cell with the tie layer. The cell press applies pressure to the photovoltaic cell to place the photovoltaic cell on the tie layer, partially encapsulated by the tie layer, or fully encapsulated by the tie layer.

When the photovoltaic cell contacts the tie layer, air bubbles become trapped between the photovoltaic cell and the tie layer. These air bubbles are disadvantageous in that the air bubbles make the module susceptible to the environment. In addition, these air bubbles reduce the light absorbing capability of the module. By applying pressure to the photovoltaic cell, the plate squeezes out some of the air bubbles between the photovoltaic cell and the tie layer. However, the application of pressure to the photovoltaic cell does not remove all of the air bubbles between the photovoltaic cell and the tie layer if the tie layer is a liquid or does not have sufficient tack or penetration to allow it to conform or remain in contact with the tie layer, which results in the disadvantages previously described. In addition, to remove any considerable amount of air bubbles, the pressure must be applied to the photovoltaic cell for a substantial amount of time while the air bubbles slowly flow out from between the photovoltaic cell and the tie layer which makes for a slower process and therefore may not be cost effective. In other words, the requirement that pressure must be applied to the photovoltaic cell increases the cycle time for the production of the module, which is obviously undesirable from a manufacturing standpoint because fewer modules can be assembled in a given amount of time. As such, the application of pressure to remove the air bubbles from between the photovoltaic cell and the tie layer is disadvantageously ineffective and time consuming.

Accordingly, there remains an opportunity to develop a cell press and a method of forming the module that eliminates air bubbles between the photovoltaic cell and the tie layer. There also remains an opportunity to develop a cell press and a method of forming a module in a time efficient and cost effective manner.

SUMMARY OF THE INVENTION AND ADVANTAGES

The present invention includes a method of forming a photovoltaic cell module including a photovoltaic cell with the use of a cell press having a table and a plate that is spaced from and moveable relative to the table. The method comprises disposing the photovoltaic cell between the plate and the table with the photovoltaic cell spaced from the table. The method further comprises introducing a substrate and a tie layer between the photovoltaic cell and the table with the substrate supported by the table and with the tie layer supported by the substrate between the substrate and the photovoltaic cell with a space between the photovoltaic cell and the tie layer. The method further includes moving at least one of the photovoltaic cell and the table toward the other until the photovoltaic cell contacts the tie layer and applying a vacuum between the photovoltaic cell and the tie layer such that the space between the photovoltaic cell and the tie layer is evacuated as the photovoltaic cell contacts the tie layer.

The present invention also includes a cell press for forming a photovoltaic cell module. The cell press comprises a table for supporting a substrate and a tie layer supported by the substrate. A plate is spaced from the table and at least one of the table and the plate is moveable toward and away from the other. The cell press includes a mechanism for suspending a photovoltaic cell spaced from the substrate and the tie layer against the plate to define a space between the photovoltaic cell and the tie layer. The cell press also includes a vacuum system for evacuating the space between the photovoltaic cell and the tie layer as at least one of the table and the plate moves toward the other.

Because the space between the photovoltaic cell and the tie layer is evacuated, air bubbles are not formed between the photovoltaic cell and the tie layer. As a result, the module is structurally strong, i.e., more resistant to the environmental damage, and absorbs an increased amount of light. In addition, because air bubbles are not formed, the amount of pressure and duration of the application of pressure to encapsulate the photovoltaic cell in the tie layer is reduced. The elimination of the step of pressing reduces the time required to form the module and reduces the risk of breaking the cells during the process. This reduction of time and cell breakage increases the cost effectiveness of the formation of the module.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
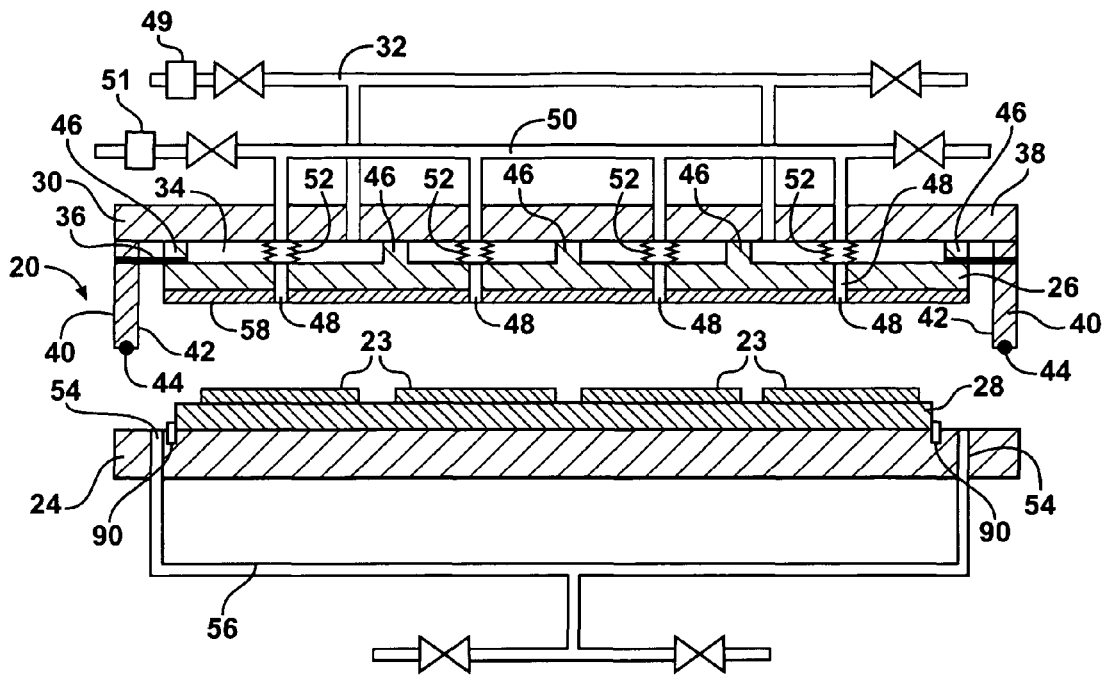
FIG. 1 is a cross-sectional view of a cell press with a table of the cell press supporting a plurality of photovoltaic cells and with a plate of the cell press in retracted position spaced from the photovoltaic cells.

Referring to the Figures, wherein like numerals indicate like parts throughout the several views, the present invention includes a cell press generally shown at 20 and a method of forming a photovoltaic cell module 22 (hereinafter referred to as "module") with the use of the cell press 20. The module 22 typically includes a photovoltaic cell 23 and typically includes at least a substrate 64 and a tie layer 66 coupled to the photovoltaic cell 23. It should be appreciated that the module 22 can include a plurality of photovoltaic cells 23 and the plurality of photovoltaic cells can be arranged as an array of photovoltaic cells 23. Typically the array of photovoltaic cells 23 are electronically interconnected together. The photovoltaic cell 23 will be described in detail further below. It should be appreciated that the cell press 20 is not limited to the module 22 and the method disclosed herein and can be used to form products other than the module 22 that is disclosed herein and can be used to perform methods other than the method disclosed herein. In addition, it should be appreciated that the method is not limited to the photovoltaic cell 23 and the cell press 20 disclosed herein and can be used to form products other than the module 22 that is disclosed herein and can be performed with apparatuses other than the cell press 20 disclosed herein.

Figure 2:
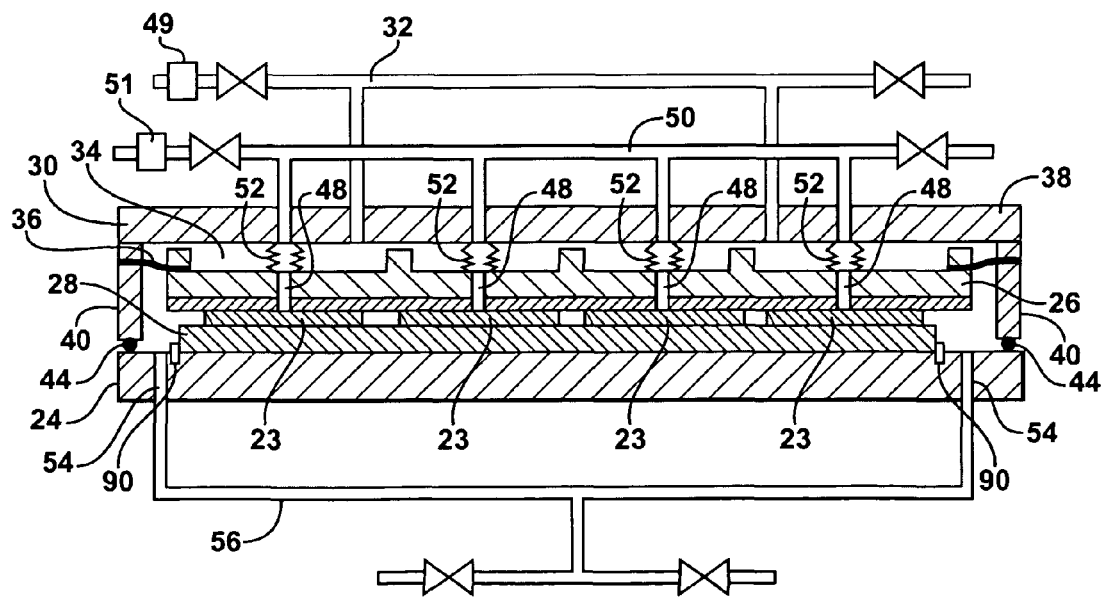
FIG. 2 is a cross-sectional view of the cell press with the plate in an extended position in contact with the photovoltaic cells.

The cell press 20 includes a table 24 and a plate 26 spaced from the table 24. In the configuration shown in the figures, the table 24 is maintained stationary and is positioned horizontally to support pieces of the module 22 prior to, during, and subsequent to formation of the module 22, as will be discussed below. As best shown in FIGS. 1 and 2, a shuttle plate 28 can be used to transport the photovoltaic cell 23 between the table 24 and the plate 26.

The plate 26 and the table 24 are moveable relative to each other. In other words, either the plate 26 can be stationary with the table 24 moveable relative to the plate 26; the table 24 can be stationary with the plate 26 moveable relative to the table 24; or both the plate 26 and the table 24 are moveable. In the configuration shown in the Figures, the plate 26 is maintained parallel to the table 24 to ensure even pressure on the module 22 between the table 24 and the plate 26 during formation of the module 22.

The cell press 20 can include a lid 30 with the plate 26 coupled to the lid 30 between the lid 30 and the table 24. The plate 26 is moveable relative to the lid 30 toward and away from the table 24. The plate 26 can be moved relative to the lid 30 by any type of motion transmitting system including, but not limited to, pneumatic, hydraulic, or mechanical systems.

In the configuration shown in the Figures, the plate 26 is pneumatically coupled to the lid 30. In other words, the relative movement of plate 26 with respect to the lid 30 is pneumatically controlled by a first vacuum system 32. The plate 26 and the lid 30 define a chamber 34 therebetween and are hermetically sealed to each other with a seal 36. The seal 36 can be, for example, a resilient material, such as rubber or like material, to ensure separation of the areas above and below the plate 26 in addition to allowing the plate 26 to move relative to the lid 30.

For example, the first vacuum system 32 includes a pair of valves. In such a configuration, one of the valves is closed and vacuum is pulled through the other valve to pull the plate 26 toward the lid 30. The vacuum can be released by opening the valves to allow the plate 26 to move away from the lid 30.

The lid 30 and the table 24 are moveable relative to one another. Typically, the table 24 remains stationary and the lid 30 moves toward and away from the lid 30. It should be appreciated that the lid 30 and the table 24 can move relative to each other translationally or rotationally, i.e., about a hinge. It should also be appreciated that the lid 30 and the table 24 can be moved relative to each other by manual operation or by a system operated hydraulically, pneumatically, mechanically, etc.

The lid 30 is configured to hermetically seal to the table 24. Specifically, the lid 30 includes a top 38 and side walls 40. Ends 42 of side walls 40 are designed to hermetically seal with the table 24 when brought into contact with the table 24. The seal is achieved in FIGS. 2, 4, and 5 by a lid seal 44. The lid seal 44 is, for example, an "O" type ring; however, any suitable alternative may be used to ensure that the side walls 40 are hermetically sealed to the table 24.

The cell press 20 includes at least one mechanical stop 46 that prevents the press plate 26 from retracting too far toward the lid 30. In the configuration shown in the figures, the mechanical stop 46 is disposed between the press plate 26 and the lid 30.

The plate 26 is configured to suspend the photovoltaic cell 23 from the substrate 64 and the tie layer 66 to define a space between the photovoltaic cell 23 and the tie layer 66. Specifically, the plate 26 defines an aperture 48 and more specifically defines a plurality of apertures through which vacuum is drawn to suspend the photovoltaic cell 23, as set forth in greater detail below. In the configuration shown in FIGS. 1-6, each aperture 48 is connected to a second vacuum system 50 via a plurality of connecting tubes 52. For example, the second vacuum system 50 includes a second pair of valves which are used to pull and relieve vacuum through the plurality of apertures.

The table 24 defines a table aperture 54 and more specifically defines a plurality of table apertures. Each table aperture 54 is connected to a third vacuum system 56. For example, the third vacuum system 56 includes a third pair of valves. The third vacuum system 56 is provided such that when the lid 30 and the table 24 are sealed together, the atmosphere in the region between the plate 26 and the table 24 can be controlled by, for example, closing one of the third pair of valves and applying a vacuum through the other. Typically, for example, a full vacuum, i.e., 30 in.Hg., is drawn between the table 24 and the plate 26 with the third vacuum system 56 to eliminate the formation of air bubbles between the photovoltaic cell 23 and the tie layer 66 as described further below. However, it should be appreciated that the vacuum between the table 24 and the plate 26 can be less than a full vacuum without departing from the nature of the present invention. For example, the vacuum between the plate 26 and the table 24 can have a magnitude of less than 25 in.Hg, i.e., less than 0 in.Hg and greater than −25 in.Hg relative to atmospheric pressure.

While it is intended for the formation of the module 22 to be undertaken in vacuum, if the process requires the presence of an inert atmosphere, then an inert gas (e.g. nitrogen) may be introduced through one of the third pair of valves. Furthermore, for situations where it is essential to remove oxygen, the space between the plate 26 and the table 24 could be purged with an inert gas via one of the third pair of valves, prior to applying the vacuum. It should be appreciated that the first, second, and third vacuum systems can have a common vacuum source or different vacuum sources.

The first vacuum system 32 can include a first pressure differential controller 49 to control the difference in vacuum between the third vacuum system 56 the and first vacuum system 32. Specifically, for example, when vacuum is drawn between the table 24 and the plate 26 by the third vacuum system 56, the first pressure differential controller 49 initially maintains the vacuum in the first pressure system 32 such that the plate 26 remains spaced from the table 24. After vacuum is drawn between the plate 26 and the table 24 by the third pressure system 56, the first pressure differential controller 49 releases the vacuum, i.e., to reach atmospheric pressure, in the first vacuum system 32 such that the vacuum between the plate 26 and the table 24 pulls the plate 26 toward the table 24. Alternatively, the first pressure differential controller 49 partially releases the vacuum in the first vacuum system 32. In such a scenario, the first pressure differential controller 49 partially releases vacuum, i.e., maintains some vacuum in the first vacuum system 32 to avoid excess pressure on the photovoltaic cell 23 by the plate 26 and the table 24, which could lead to breaking of the photovoltaic cell 23 such as by cracking. For example, the first pressure differential controller 49 can release vacuum in the first pressure system 32 to maintain a vacuum difference between the third pressure system 56 and the first pressure system 32 of 3-30 in.Hg.

The first pressure differential controller 49 can control a positive pressure between the plate 26 and the lid 30 to force the plate 26 toward the table 24 as vacuum is drawn between the plate 26 and the table 24 by the third vacuum system 56. Such a positive pressure can be introduced between the plate 26 and the lid 30 to, for example, decrease the cycle time of the cell press 20 and/or to force the photovoltaic cell 23 into the tie layer 66. It should be appreciated that the positive air pressure can be delivered through the first vacuum system 32 or through a separate system.

For example, the first pressure differential controller 49 can include pressure sensors (not shown) in communication with the first 32 and third 56 vacuum systems, an electronics controller (not shown) in communication with the pressure sensors, and at least one valve in communication with the electronics controller for controlling the vacuum of the first vacuum system 32. It should be appreciated that the first pressure differential controller 49 is exemplary and any controller can be used to regulate the pressure of the first vacuum system 32 relative to the third vacuum system 56 without departing from the nature of the present invention.

The second vacuum system 50 can include a second pressure differential controller 51 to maintain the magnitude of the vacuum of the second vacuum system 52. In other words, as the third vacuum system 56 changes the vacuum between the plate 26 and the table 24, the second pressure differential controller 51 changes the vacuum of the second vacuum system 52 to maintain the difference in vacuum between the second vacuum system 52 and the third vacuum system 56. The second pressure differential controller 51 can maintain the vacuum of the second vacuum system 52 slightly below that of the third vacuum system 56, e.g., as small as 0.5 in.Hg, as will be described further below. The second pressure differential controller 51 can, for example, maintain the pressure difference at a level such that the photovoltaic cell 23 can be suspended without damaging the photovoltaic cell 23 such as by cracking. However, it should be appreciated that the second pressure differential controller 51 can maintain the vacuum difference at any magnitude from between 0 and 30 in.Hg without departing from the nature of the present invention.

For example, the second pressure differential controller 51 can include pressure sensors (not shown) in communication with the second 52 and third 56 vacuum systems, an electronics controller (not shown) in communication with the pressure sensors, and at least one valve in communication with the electronics controller for controlling the vacuum of the second vacuum system 52. It should be appreciated that the second pressure differential controller 51 is exemplary and any controller can be used to regulate the pressure of the second vacuum system 52 relative to the third vacuum system 56 without departing from the nature of the present invention.

The plate 26 can have a layer of cushioning material 58 attached thereto. The cushioning material 58 prevents damage to pieces of the module 22 when the plate 26 contacts the pieces, as will be discussed below. The cushioning material 58 includes openings aligned with the apertures 48. The size of the openings is typically larger than the size of the apertures 48. The size of the openings relative to the apertures 48 are dependent upon the softness of the cushioning material 58.

Figure 5:
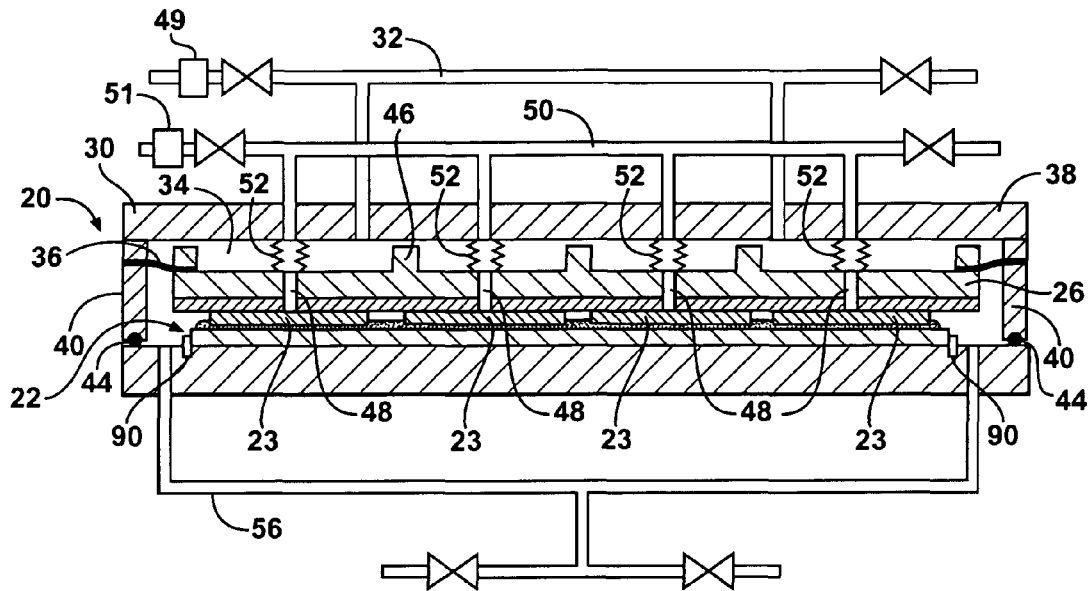
FIG. 5 is a cross-sectional view of the cell press with the plate in the extended position with the photovoltaic cells in contact with the tie layer.
Figure 6:
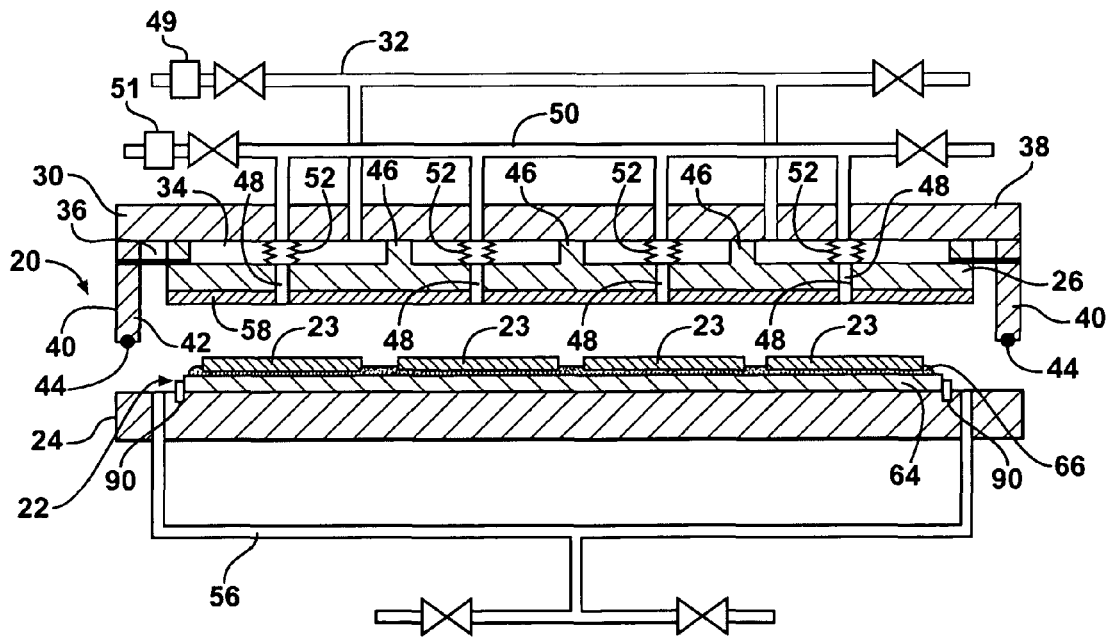
FIG. 6 is a cross-sectional view with the plate in the retracted position spaced from the photovoltaic cells.
Figure 7:
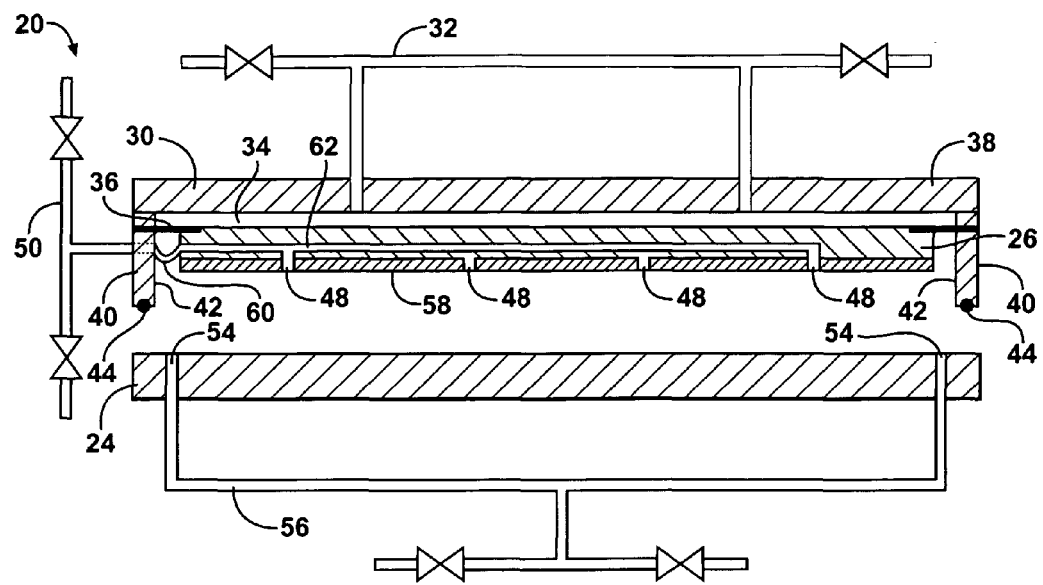
FIG. 7 is a cross-sectional view of another embodiment of the cell press.

FIG. 7 shows an additional embodiment of the present invention and the same numbering scheme is used as in FIGS. 1 to 6. In the embodiment of FIG. 7, the need for the plurality of connecting tubes 52 is avoided by replacing the connecting tubes 52 with a single connecting tube 60 which links the second vacuum system 50 to a bore 62 in the plate 26. The bore 62 is connected to the apertures 48 in the plate 26.

The module 22 includes a substrate 64, a tie layer 66 applied to the substrate 64, and a photovoltaic cell 23 encapsulated, either partially or fully, by the tie layer 66. The substrate 64 and the tie layer 66 are typically transparent to allow light to reach the photovoltaic cell. The substrate 64 is typically glass, however, it should be appreciated that the substrate 64 can be any type of material without departing from the nature of the present invention. For example, the substrate 64 could be metal foils and/or organic fluoropolymers such as ethylene tetrafluoroethylene (ETFE), polyvinyl fluoride (PVF), Tedlar®, polyester/Tedlar®, Tedlar®/polyester/Tedlar®, or polyethylene terephthalate (PET) alone or coated with silicon and oxygen based materials ($SiO_x$), or PET/$SiO_x$-PET/Al substrate. Dependent on the chemical nature of the substrate 64, the tie layer 66 may be applied to the substrate 64 untreated but, where deemed appropriate, a suitable primer or adhesion promoter may be applied on the substrate 64 surface to ensure good adhesion between the tie layer 66 and the substrate 64.

The tie layer 66 may be further defined as an encapsulant and is typically a silicone encapsulant or an organic encapsulant. The tie layer 66 may be any silicone encapsulant or any organic encapsulant, such as ethyl vinyl acetate (EVA). EVA is a thermoplastic which melts at temperatures above 80° C.

However, at temperatures of from about 25° C. to less than about 80° C., the EVA can be a gel or can be gel-like. Organic encapsulants such as EVA can be reformulated to form a gel or be gel-like even at elevated temperatures. Although not required, the tie layer 66 typically has a penetration of from 0.1 to 100 mm and a tack value of less than −0.6 g.sec. The value "penetration" may also be commonly referred to as "depth of penetration" or "penetration value". Although the penetration and the tack value are typically determined at room temperature, this range for the penetration and the tack value applies at any other temperature as well. While the tie layer can be a silicone material in accordance with the applicants' co-pending U.S. Provisional Patent Application Nos. 61/036,752 filed on Mar. 14, 2009 and 61/146,551 filed on Jan. 22, 2009, any suitable silicone material may be utilized without departing from the nature of the present invention.

In the scenario where the module 22 includes an array of photovoltaic cells, typically the array of photovoltaic cells 23 are electronically interconnected together prior to placement on the shuttle plate 28. Hence the electrically connected array of photovoltaic cells 23 is usually placed on shuttle plate 28 in a predetermined position. The photovoltaic cells 23 can be electrically connected into appropriately sized and shaped arrays and appropriately positioned suitable bus bars are soldered thereto in order that the array can be electrically connected externally subsequent to formation of the module 22.

Figure 8:
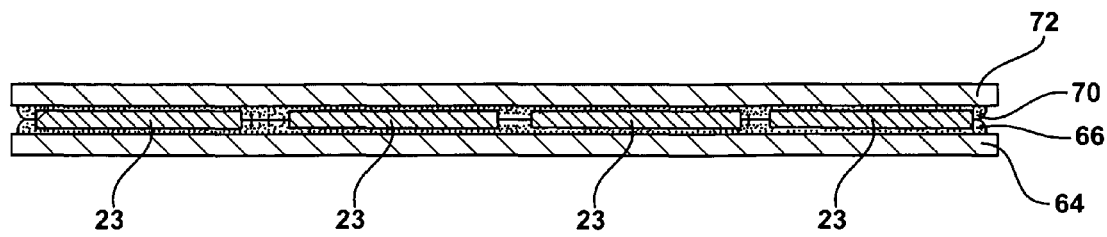
FIG. 8 is a cross-sectional view of the photovoltaic cell module including a substrate and a second substrate, a tie layer and a second tie layer, and a plurality of photovoltaic cells.

As shown in FIG. 8, the module 22 can also include a second tie layer 70 partially encapsulating the photovoltaic cell 23 opposite the photovoltaic cell 23 from the tie layer 66, and a second substrate 72 mounted to the second tie layer 70 opposite the second tie layer 70 from the photovoltaic cell 23. The second substrate 72 is typically referred to in industry as a backsheet. The second substrate 72 can be the same as or different than the first substrate 64 and the second tie layer 70 can be the same as or different than the tie layer 66. At least one of the substrate 64 and the second substrate 72 is transparent to sunlight and is used to protect one side of the photovoltaic cell 23 from potentially harmful environmental conditions.

For example, the second tie layer 70 may be a silicone based liquid or gel, a hot melt silicone sheet of the type described in the applicant's co-pending application PCT/US06/043073 or any other suitable encapsulant material, e.g. ethyl vinyl acetate (EVA), Tedlar® films from E.I. DuPont de Nemours & Co. of Wilmington Del., and UV curable urethanes providing there is sufficient adherence between the second tie layer 70 and the tie layer 66. The second tie layer 70 does not need to be transparent to light and therefore, when present, may be strengthened by the incorporation of reinforcing particulate fillers therein. When the second tie layer 70 is filled with the reinforcing particulate fillers, the additional strength provided by the reinforcing particulate filler avoids the need for a second substrate 72.

The module 22 is of the type that converts light energy into electrical energy due to a photovoltaic effect. More specifically, modules 22 perform two primary functions. A first function is photogeneration of charge carriers such as electrons and holes in light absorbing materials. The second function is direction of the charge carriers to a conductive contact to transmit electricity.

The module 22 can be used in any industry including, but not limited to, automobiles, small electronics, remote area power systems, satellites, space probes, radiotelephones, water pumps, grid-tied electrical systems, batteries, battery chargers, photoelectrochemical applications, polymer solar cell applications, nanocrystal solar cell applications, and dye-sensitized solar cell applications. Modules 22 are typically used on rooftops, in rural areas connected to battery backups, and in DC pumps, signal buoys, and the like. The array may be planar or non-planar and typically functions as a single electricity producing unit wherein the modules 22 are interconnected in such a way as to generate voltage.

The method of the present invention provides for the assembly of the substrate 64, the tie layer 66, and the photovoltaic cell 23 of the module 22. It should be appreciated that the method can be used to form one photovoltaic cell 23 with the tie layer 66 or can be used to form the array of photovoltaic cells 23 with the tie layer 66. The method also provides for the assembly of the second tie layer 70 and the second substrate 72 of the module 22.

The method includes positioning the cell press 20 in an open position and specifically includes moving the plate 26 to a retracted position in the lid 30 and moving the lid 30 away from the table 24 to the position shown in FIG. 1. More specifically, the method includes applying a vacuum between the lid 30 and the plate 26 to move the plate 26 toward the lid 30 to the retracted position.

With the cell press 20 in the open position, the method includes disposing the photovoltaic cell 23 between the plate 26 and the table 24 as shown in FIG. 1. Specifically, for example, one or more photovoltaic cells 23 are simultaneously placed on the shuttle plate 28 in the appropriate predetermined positions and the shuttle plate 28 is placed in a predetermined position on the table 24. The shuttle plate 28 supports the photovoltaic cell 23 for transferring the photovoltaic cell 23 between the table 24 and the plate 26. The photovoltaic cell 23 may be introduced using any suitable means which can be automatically operated, manually operated or robotically operated. For example a multi-axis robot, (preferably six axes) may be integrated into the system for positioning the photovoltaic cell 23 on the shuttle plate 28 or the like or directly onto the table 24, if the shuttle plate 28 is not used. Such a robot may additionally be subsequently used for accurate positioning of the substrate 64 onto the table 24 and for removing the substrate 64 with the photovoltaic cell 23 pressed in or on the tie layer 66. A robotic gripper for holding and manipulating the photovoltaic cell 23 and/or substrate 64, i.e. the device attached to the mounting arm of the robot that will manipulate the photovoltaic cell 23 or modules 22, may be of any suitable type but is preferably a series of vacuum suction cups adapted to hold the photovoltaic cell 23 or modules 22 in a flat, typically horizontal, plane.

After the photovoltaic cell 23 is disposed between the plate 26 and the table 24, the lid 30 is moved toward the table 24 and into contact with the table 24. Specifically, the lid seal 44 contacts the table 24 and seals the lid 30 to the table 24.

In the scenario where the photovoltaic cell 23 is further defined as an array of photovoltaic cells 23, the array is assembled to the tie layer 66. The method includes introducing the array of photovoltaic cells 23 between the table 24 and the plate 26 with the photovoltaic cell 23 aligned with the plurality of apertures of the plate 26. In other words, the array of photovoltaic cells 23 is positioned so that when the lid 30 is closed and the press plate 26 is moved toward the photovoltaic cell 23, as described below, each of the array of photovoltaic cells 23 is in contact with the plate 26 at one of the apertures 54, respectively.

After the photovoltaic cell 23 is disposed between the plate 26 and the table 24 and the lid 30 is sealed to the table 24, the method further includes moving one of the photovoltaic cell 23 and the plate 26 toward the other to engage, e.g., contact, the plate 26 with the photovoltaic cell 23 as shown in FIG. 2. Specifically, as stated above, a vacuum is applied between the lid 30 and the plate 26 to move the plate 26 toward the lid 30 to the retracted position and this vacuum maintains the plate 26 in the retracted position. A vacuum is then applied between the plate 26 and the table 24 with the third vacuum system 56. The vacuum between the lid 30 and the plate 26 is then relieved to allow the plate 26 to move relative to the lid 30 toward the photovoltaic cell 23 to the extended position. Specifically, once the shuttle plate 28 is correctly positioned on table 24, the lid 30 is closed and the plate 26 is extended by release of the vacuum previously applied between the lid 30 and the plate 26 so that the cushioning material adhered to plate 26 comes into contact with the photovoltaic cell 23 on shuttle plate 28.

Figure 3:
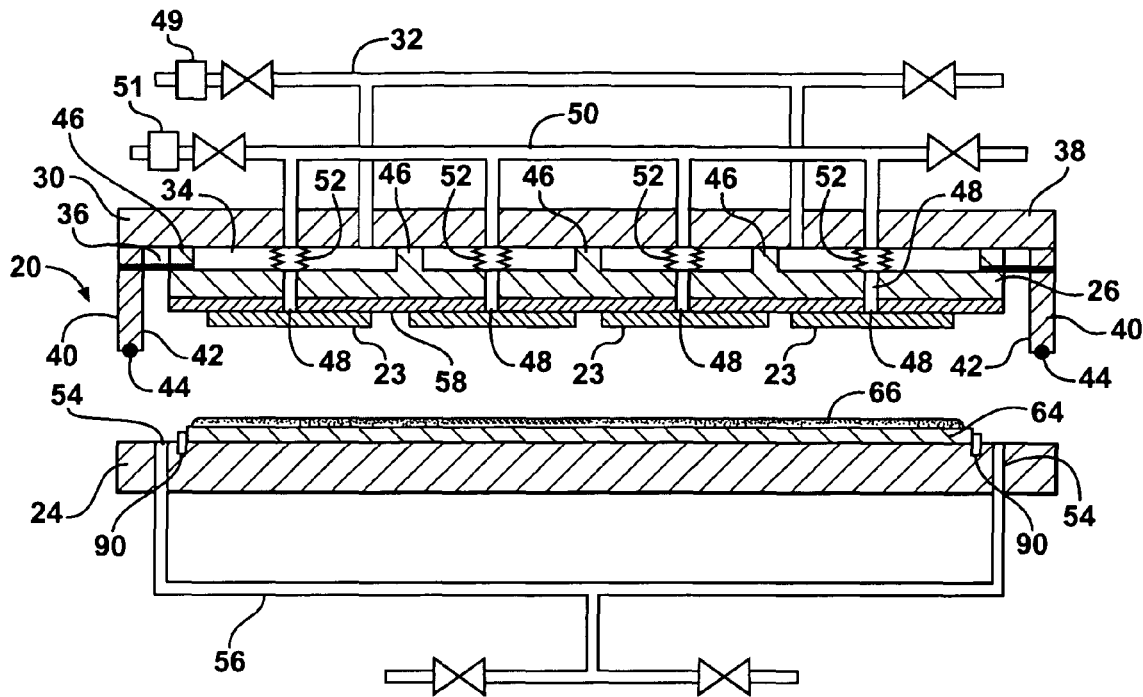
FIG. 3 is a cross-sectional view of the cell press with the plate supporting the photovoltaic cells in the retracted position and with the table supporting a substrate and a tie layer.

The method further includes maintaining the photovoltaic cell 23 spaced from the table 24, i.e., suspended from the table 24. Specifically, the plate 26 supports the photovoltaic cell 23, i.e., the plate 26 maintains the photovoltaic cell 23 in a position spaced from the table 24 as best shown in FIG. 3. In the configuration shown in the Figures, when the plate 26 is engaged with the photovoltaic cell 23, the method further includes applying vacuum with the second vacuum system 50 through the aperture 48 between the aperture 48 and the photovoltaic cell 23 to pull the photovoltaic cell 23 toward the plate 26. It should be appreciated that the cell press 20 can impart a force, e.g., by vacuum, to lift the photovoltaic cell 23 from above as best shown in FIG. 3 or alternatively, in a different configuration not shown in the figures, the plate 26 can support the photovoltaic cell 23 from below the photovoltaic cell 23. It should also be appreciated that the plate 26 can support the photovoltaic cell 23 in any manner other than by vacuum without departing from the nature of the present invention.

In the configuration including the second pressure differential controller 51, the second pressure differential controller 51 can be used to maintain a low pressure differential between the second 52 and third 56 vacuum systems to minimize the possibility of breaking the photovoltaic cells 23, such as by cracking. In other words, the second pressure differential controller 51 can be used to maintain the vacuum in the second vacuum system 52 at high enough of a magnitude to maintain the photovoltaic cells 23 against the plate 26 and at low enough of a magnitude such that the photovoltaic cells 23 do not break from the vacuum. Specifically, the vacuum of the second vacuum system 52 can be at a low magnitude when the space between the plate 26 and the table 24 is at atmospheric pressure. When the space between the plate 26 and the table 24 is evacuated by the third vacuum system 56, the vacuum of the second vacuum system 54 must be increased to maintain the photovoltaic cells 23 against the plate 26.

In the embodiment described herein, the first 52 and the third 56 vacuum systems are used to move the plate 26 relative to the table 24. In an alternative embodiment, the table 24 and/or the shuttle plate 28 includes at least one pin that supports the photovoltaic cell 23. The pin is extended to move the photovoltaic cell 23 toward the plate 26 to engage the photovoltaic cell 23 with the plate 26. For example, the pin can extend to move the photovoltaic cell 23 toward the aperture 54 and the second vacuum system can apply vacuum in the aperture 54 to hold the photovoltaic cell 23 against the plate 26.

Once the vacuum is applied through the apertures to lift the photovoltaic cell 23, the method further includes applying a vacuum between the lid 30 and the plate 26 to space the plate 26 from the table 24. In other words, vacuum is applied between the lid 30 and the plate 26 and the plate 26 is retracted such that the photovoltaic cell 23 is retained in contact with the cushioning material on press plate 26 while the press plate 26 is in its retracted position. The cell press 20 is positioned in an open position, i.e., the lid 30 is moved away from the table 24. With the cell press 20 in the open position, the shuttle plate 28 is removed.

The method further includes introducing the substrate 64 and the tie layer 66 between the photovoltaic cell 23 and the table 24 in a predetermined position, as best shown in FIG. 3. The substrate 64 is supported by the table 24 and the tie layer 66 is supported by the substrate 64 between the substrate 64 and the photovoltaic cell 23. The photovoltaic cell 23 and the tie layer 66 define a space therebetween.

Figure 4:
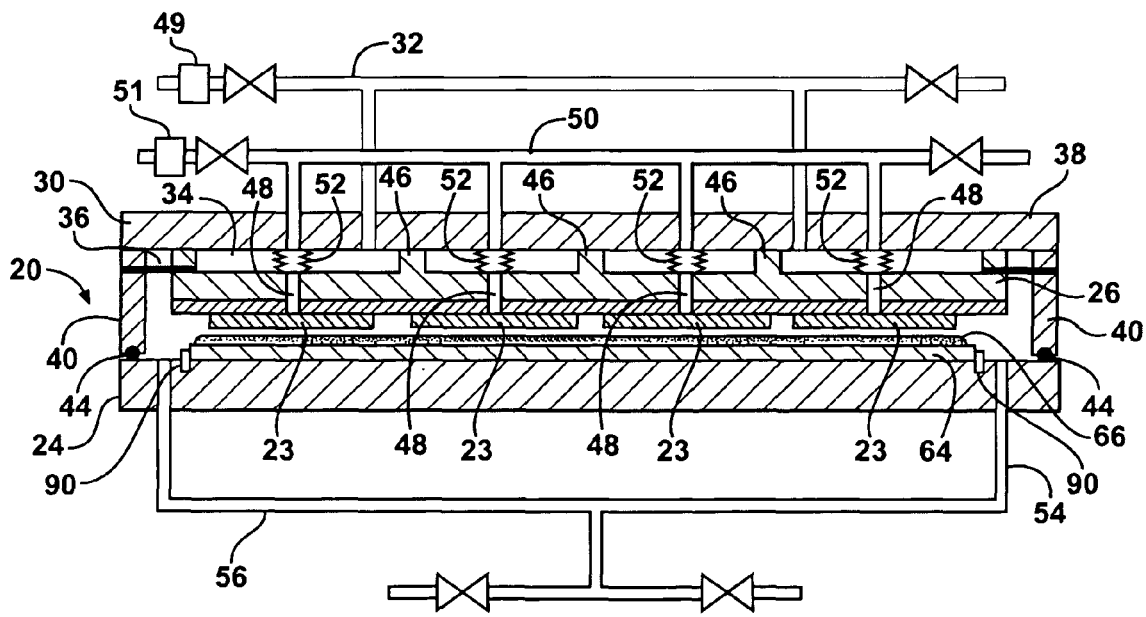
FIG. 4 is a cross-sectional view of the cell press the cell press in a closed position and the plate in the retracted position.

After the substrate 64 and the tie layer 66 are disposed between the photovoltaic cell 23 and the table 24, the method further includes moving the lid 30 toward the table 24 and into contact with the table 24, as best shown in FIG. 4. Specifically, the lid seal 44 contacts the table 24 and seals the lid 30 to the table 24.

After the lid 30 is sealed to the table 24, the method further includes moving one of the photovoltaic cell 23 and the table 24 toward the other until the photovoltaic cell 23 contacts the tie layer 66 as shown in FIG. 5. In the configuration shown in the Figures, the plate 26 is moved relative to the table 24 by applying a vacuum between the plate 26 and the table 24 to move the plate 26 toward the table 24. Specifically, the vacuum between the lid 30 and the plate 26 is relieved after the vacuum between the plate 26 and the table 24 is applied to allow the plate 26 to move toward the table 24. In addition, positive pressure may be introduced between the plate 26 and the lid 30 to move the plate 26 toward the table 24. Because the vacuum is applied between the plate 26 and the table 24, the space between the photovoltaic cell 23 and the tie layer 66 is evacuated as the photovoltaic cell 23 contacts the tie layer 66.

In other words, once the lid 30 is closed, an enclosed region formed by plate 26, table 24, walls 40, and lid 30 is evacuated by application of a vacuum through the third vacuum system 56. Upon evacuation as depicted in FIG. 5, the plate 26 is then extended by release of vacuum through the first vacuum system 32. Extension of plate 26 while the photovoltaic cell 23 is supported by the plate 26 by application of vacuum through the apertures results in the photovoltaic cell 23 being forced into, partially into, or onto tie layer 66. In addition, in the scenario where positive pressure is introduced between the plate 26 and the lid 30, the plate forces the photovoltaic cell 23 into, or partially into, or onto the tie layer 66. The tie layer 66 can also be heated to promote adequate insertion of the photovoltaic cell 23 into, or partially into, or onto the tie layer 66. In a scenario where the tie layer 66 is heated, the plate 26 and/or the table 24 can be heated to conductively heat the tie layer 66.

Because the space between the photovoltaic cell 23 and the tie layer 66 is evacuated, air bubbles are not formed between the photovoltaic cell 23 and the tie layer 66. As a result, the module 22 is structurally strong and absorbs an increased amount of light. In addition, because air bubbles are not formed, the photovoltaic cell 23 does not need to be pressed to squeeze the air bubbles out from between the photovoltaic cell 23 and the tie layer 66. The elimination of the step of pressing reduces the time required to form the module 22. This reduction of time increases the cost effectiveness of the formation of the module 22. For example, the time required for the pressure to be applied to the photovoltaic cell 23 is less than 15 seconds.

It should be appreciated that after the lid 30 is sealed to the table 24 with the substrate 64 and the tie layer 66 disposed therebetween and vacuum is drawn between the table 24 and the plate 26 by the third vacuum system 56, the vacuum of the first vacuum system 32 can be completely released. In other words, the first vacuum system 32 can be opened to atmospheric pressure. Alternatively, as set forth above, the first pressure differential controller 49 can partially release the vacuum of the first vacuum system 32. Alternatively, as set forth above, the first pressure differential controller 49 can introduce positive air pressure between the plate 26 and the lid 30 to move the plate 26 away from the lid 30 toward the photovoltaic cell 23.

After the photovoltaic cell 23 contacts the tie layer 66, the vacuum through the aperture 48 of the plate 26 is relieved to release the photovoltaic cell 23 from the plate 26. After relieving the vacuum through the aperture 48 of the plate 26, the method includes moving one of the plate 26 and the table 24 away from the other as shown in FIG. 6. More specifically, in the configuration shown in the figures, the method includes applying a vacuum between the lid 30 and the plate 26 and relieving the vacuum between the plate 26 and the table 24 to move the plate 26 toward the lid 30 away from the table 24 to the retracted position.

After the plate 26 is moved away from the table 24, the lid 30 is moved away from the table 24 to allow for the removal of the substrate 64, tie layer 66, and photovoltaic cell 23 from between the plate 26 and the table 24. The substrate 64, tie layer 66, and photovoltaic cell 23 can then be removed from between the plate 26 and the table 24. When the substrate 64, tie layer 66, and photovoltaic cell 23 are removed from between the plate 26 and the table 24, the method described above with respect to the cell press 20 of the present invention is be repeated with a new substrate 64, tie layer 66, and photovoltaic cell 23.

In the scenario where the second tie layer 70 and the second substrate 72 are applied to the module 22, the second tie layer 70 and the second substrate 72 can be applied either prior to or after the removal of the substrate 64, tie layer 66, and photovoltaic cell 23 from the cell press 20.

When the second tie layer 70 and the second substrate 72 are applied after removal of the substrate 64, tie layer 66, and photovoltaic cell 23 from the cell press 20, for example, the substrate 64, tie layer 66, and photovoltaic cell 23 can then be transferred a curing system such as an oven or to a further coater when required to complete the formation of the module 22. Specifically, when the second tie layer 70 is applied to the photovoltaic cell 23, the tie layer 66 and/or the second tie layer 70 can be partially or fully cured in a cure oven. The assembly of the substrate 64, the tie layer 66, the photovoltaic cell 23, and the second tie layer 70 is then typically conveyed to a station for the application of the second substrate 72 such as a pinch roll, a laminator or a device similar to the cell press 20.

As described further below, the second tie layer 70 and the second substrate 72 can, for example, be applied with the cell press 20 used to apply the photovoltaic cell 23 to the tie layer 66 or another press identical or similar to the cell press 20. However, it should be appreciated that the second tie layer 70 and the second substrate 72 can be applied in any fashion without departing from the nature of the present invention.

The tie layer 66 can be applied to the substrate 64 before the substrate 64 and tie layer 66 are introduced into the cell press 20. Alternatively, the tie layer 66 can be applied to the substrate 64 in the cell press 20. The tie layer 66 can be preformed completely independent from the substrate 64 into a film, sheet, laminate, or the like. In such a scenario where the tie layer 66 is preformed, the tie layer 66 is then typically applied to the substrate 64, outside of the cell press 20 or within the cell press 20. The tie layer 66 may be formed from and/or include any suitable compound known in the art, and these compounds may or may not require curing. Where curing applies, the compound or compounds are in the form of a curable composition. The substrate 64 can be coated with the curable composition in the cell press 20 or independent from the cell press 20. Where the substrate 64 is coated with the curable composition independent from the cell press 20, the substrate 64 and the curable composition or tie layer 66 are then introduced together into the cell press 20. Any composition which forms the tie layer 66, curable or otherwise, can be applied to the substrate 64 with a coater 74 which applies by any suitable application method known in the art including, but not limited to, spray coating, flow coating, curtain coating, dip coating, extrusion coating, knife coating, screen coating, laminating, melting, pouring, and combinations thereof.

If required, the tie layer 66 is then cured or partially cured. Typically this step takes the form of transferring/conveying the tie layer 66 on the substrate 64 to a suitable curing mechanism, typically a cure oven 76 or the like, and partially or fully curing at a predetermined temperature for a predetermined period of time. The predetermined temperature and predetermined period of time are dependent on the tie layer 66 used and degree of curing required. This is typically dependent on the approximate degree of curing required i.e., the tie layer 66 is preferably cured only to a point which allows the photovoltaic cell 23 to be manipulated or forced into, partially into, or merely onto the tie layer 66 during the application step using the equipment and method in accordance with the present invention.

The tie layer 66 is typically in a liquid or gel form. In the latter case, it is typically applied onto the substrate 64 in the form of a liquid and is then cured or partially cured into a gel. A gel in accordance with the present invention is a substantially non-flowable, highly deformable material, preferably having a cross-linked network which is able to wet and adhere to the surface of the substrate 64. Preferably such a gel remains tacky i.e., sticky, thereby enabling the cell press 20 of the present invention to ensure that the photovoltaic cell 23 may be applied on to the tacky gel with sufficient force for the photovoltaic cell 23 to be forced into, partially into, or merely onto tie layer 66. For example, in the scenario where the photovoltaic cell 23 is forced into the tie layer 66, the photovoltaic cell 23 can penetrate into the gel matrix such that it is completely surrounded on each face thereof with gel.

Any suitable method of application of the tie layer 66 to the substrate 64 may be utilized. The tie layer 66 is typically applied by flow coating. However, it is appreciated that, as described above, the tie layer 66 can be applied by spray coating, curtain coating, dip coating, extrusion coating, knife coating screen coating.

As discussed above, the tie layer 66 can be any type of material without departing from the nature of the present invention. An example of the tie layer 66 and its preparation is described hereafter and it should be appreciated that the following description is exemplary. The tie layer 66 may be formed from a composition that is a one part or multi-part composition, typically two parts having some polymer and the entire cross-linker content in one part and the remainder of the polymer with the entire catalyst content in the second part. The first and second parts are then intermixed immediately prior to application, and then the intermixed gel composition is applied onto the substrate 64 and, if required, prior to introduction into the cell press 20 of the present invention, allowed to at least partially cure. The cure process can take place at room temperature but this is likely to take several hours particularly when sub-stoichiometric levels of cross-linker are present in the composition. Such a cure process is preferably undertaken at a suitable (typically predetermined) temperature between about 0 and 200° C. dependent on factors such as required speed of cure present and the concentration of the cross-linker present in the composition. The heated curing process may be undertaken in any suitable oven or the like in either a batch or continuous mode but a continuous mode is most preferred. These cure requirements are dependent on factors such as required speed of cure present and the concentration of the cross-linker present in the composition.

The substrate 64 is typically prepared and coated prior to the application of the tie layer 66 to the substrate 64. Initially the substrate 64 is washed in water and the side of the substrate 64 onto which tie layer 66 is to be applied is further cleaned with an alcoholic solution, e.g., isopropyl alcohol. The washing with water and alcoholic solution can be performed with, for example, a substrate washer 78. The substrate 64 is typically robotically handled after washing to prevent contamination of the washed substrate 64. Alternatively, or in addition to the robotic handling, once dry, a mask or frame is placed around the perimeter of the substrate 64. The substrate 64 is then coated with encapsulant and partially cured in an oven for a period of between 1 and 15 minutes at 200° C.

A protective seal intended to cover the edges of the module 22 may be applied. Alternatively or additionally, the module 22 can be framed within a perimeter frame, typically made of aluminium or a plastic material. This is particularly important if the tie layer 66 is uncured when inserted into the cell press 20.

Figure 9:
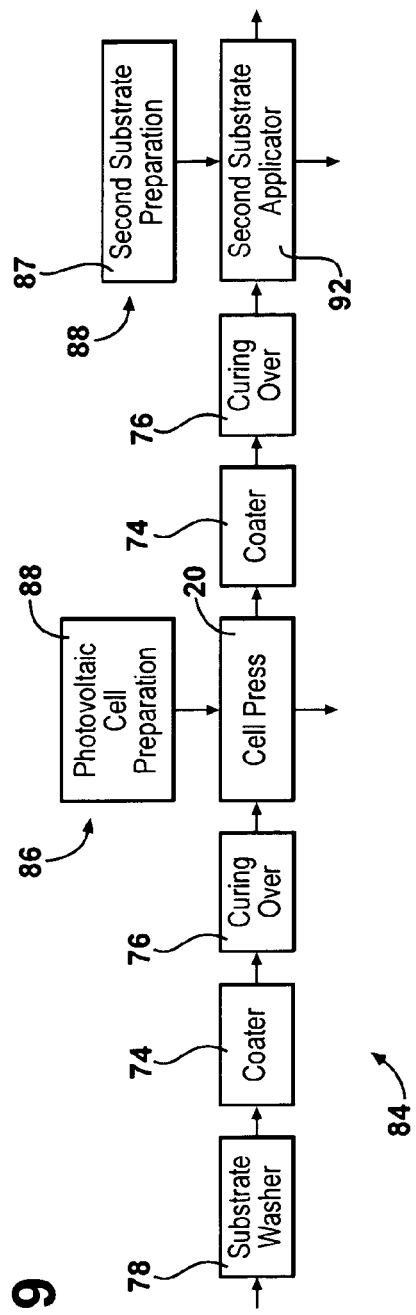
FIG. 9 is a schematic view of an assembly line including the cell press.

An embodiment of the assembly line for producing the module 22 is shown in FIG. 9. It should be appreciated that the assembly line of FIG. 9 is exemplary and the module 22 can be produced on any type of assembly line without departing from the nature of the present invention. In the embodiment shown in FIG. 9, the substrate 64, the tie layer 66, the second substrate 72, the second tie layer 70, and the photovoltaic cell 23 are moved between stations on shuttle plates 28. The shuttle plates 28 are typically moved via conveyor belts. The assembly line includes a substrate line 82, a photovoltaic cell line 84 extending transversely to the substrate line 82, and a second substrate line 86 extending transverse to the substrate line 82.

With reference to the substrate line 82, as described above, the substrate 64 is washed in the substrate washer 78. The substrate 64 is then transferred to the coater 74 where the tie layer 66 is applied to the substrate 64. The substrate 64 and tie layer 66 are then transferred to the curing oven 76 before being transferred to the cell press 20.

The photovoltaic cell line 84 includes a photovoltaic cell preparation segment 85. The photovoltaic cells 23 can be positioned on the shuttle plate 28 at the photovoltaic cell preparation segment 85. In the scenario including the array of photovoltaic cells 23, the photovoltaic cells 23 can be combined into the array at the photovoltaic cell preparation segment 85. With the cell press 20 in the open position, the shuttle plate 28 is transferred to the cell press 20. The assembly line includes a rail system including stops 90, typically extending from the table 24 as shown in FIGS. 1-6, for precisely positioning the shuttle plate 28 on the table 24 in the cell press 20. It should be appreciated that the stops 90 shown in FIGS. 1-6 are exemplary and any type of stop can be used without departing from the nature of the present invention. As described above, the cell press 20 lifts the photovoltaic cell 23 from the shuttle plate 28 and suspends the photovoltaic cell 23 from the table 24 on the plate 26. With the cell press 20 in the open position, the shuttle plate 28 is transferred out of the cell press 20.

With photovoltaic cell 23 suspended from the table 24 on the plate 26, the substrate 64 is transferred from the cure oven 76 to the cell press 20. Again, the shuttle plate 28 can be precisely positioned with the use of the stops 90. As described above, the photovoltaic cell 23 is combined with the tie layer 66 and the substrate 64.

The substrate 64, the tie layer 66, and the photovoltaic cell 23 are transferred from the cell press 20 to another coater 74 where the second tie layer 70 is applied to the photovoltaic cell 23 and the tie layer 66. The substrate 64, the tie layer 66, the photovoltaic cell 23, and the second tie layer 70 are then transferred to another curing oven 76 to cure the second tie layer 70.

The second substrate line 86 includes a second substrate preparation segment 87, which can include another substrate washer 78 to wash the second substrate 72. The second substrate 72 can be positioned on the shuttle plate 28 at the second substrate preparation segment 87. The second substrate 72 is then transferred to a second substrate applicator 92. The second substrate applicator 92 can be identical to the cell press 20 described above to perform the same method described above, i.e., to suspend the second substrate 72 and apply the second substrate 72 to second tie layer 70 in the same fashion that the photovoltaic cell 23 is suspended and applied to the tie layer 66. The description below sets forth such a method and includes common element numbering from above.

Figure 10:
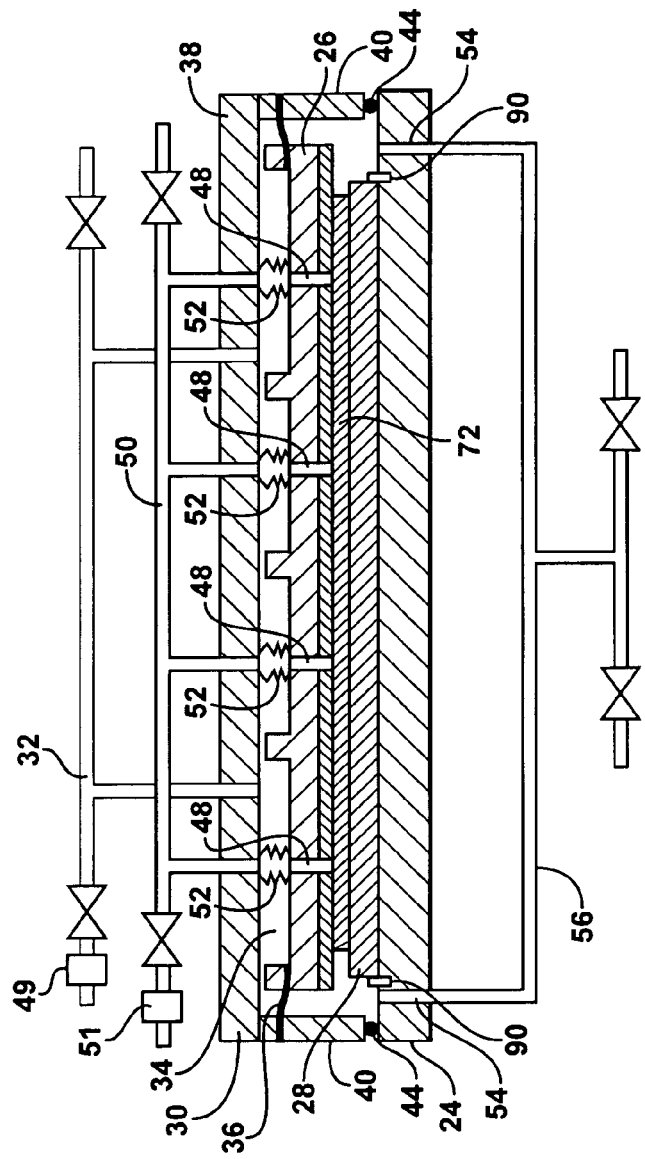
FIG. 10 is a cross-sectional view of the cell press with plate in an extended position in contact with a second substrate.

With reference to FIG. 10, when the cell press 20 is in the open position, the second substrate 72 is introduced into the cell press 20 on the shuttle plate 28, which can be precisely positioned with the use of the stops 90. The cell press 20 is then moved to the closed position, i.e., the lid 30 is moved toward the table 24 and into contact with the table 24. One of the table 24 and the plate 26 is then moved, with the use of the first 52 and third 56 vacuum systems, toward the other to engage the plate 26 with the second substrate 72. Vacuum is then applied through the apertures 48 the pull the second substrate 72 toward the plate 26. The plate 26 and the table 24 are then moved away from each other with the use of the first 52 and third 56 vacuum systems.

Figure 11:
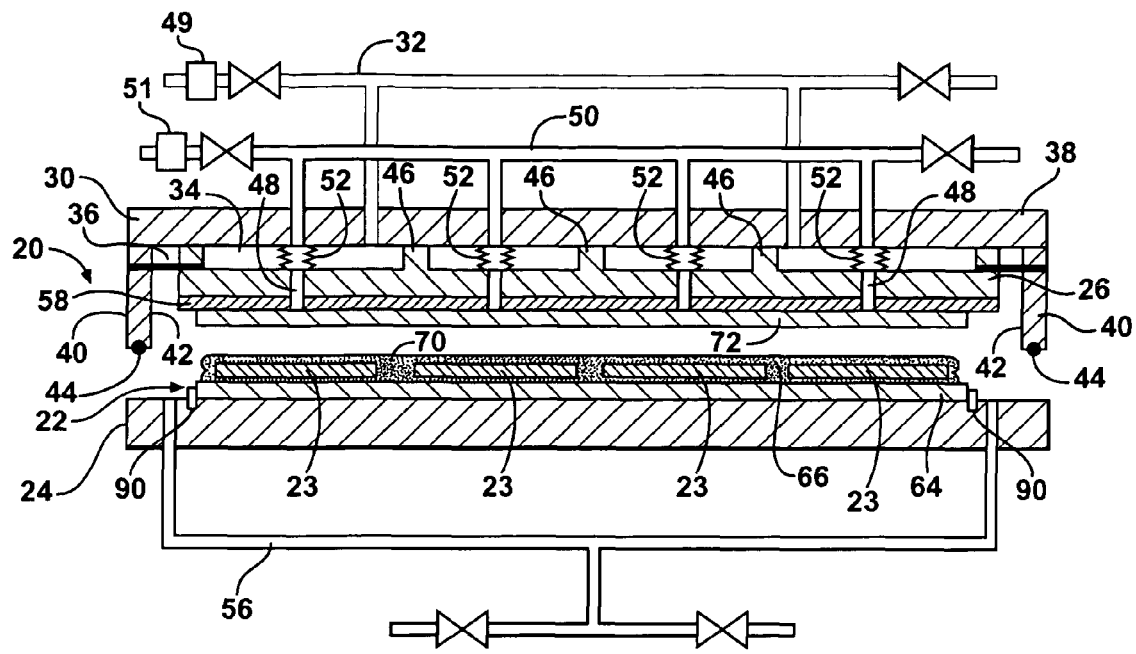
FIG. 11 is a cross-sectional view of the cell press with the plate in the retracted position suspending the second tie layer from the substrate, the tie layer, and the photovoltaic cell.
Figure 12:
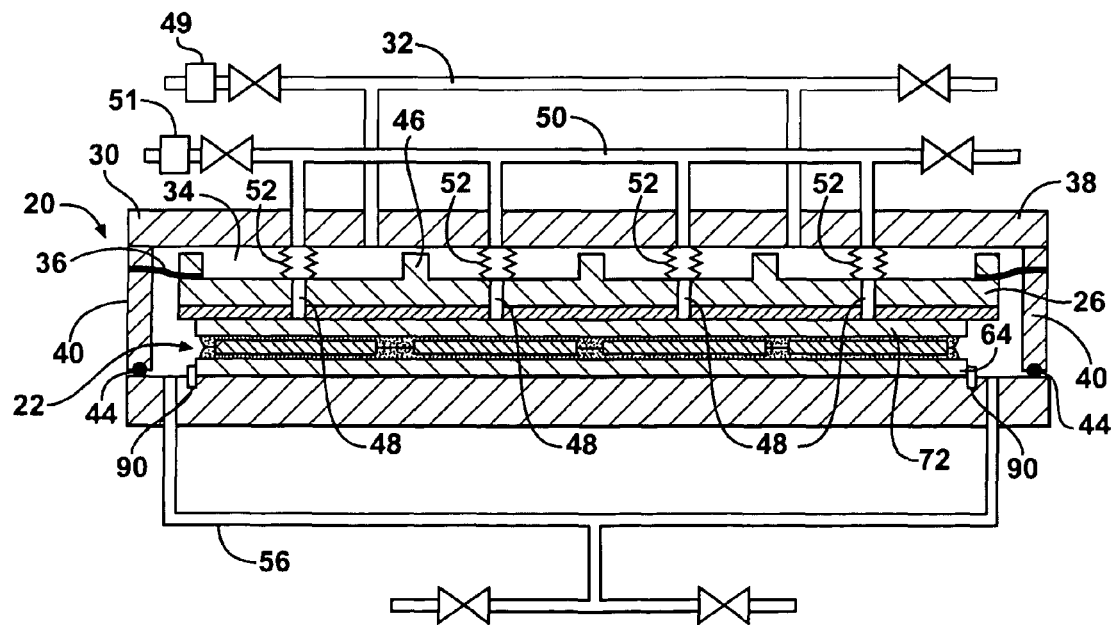
FIG. 12 is a cross-sectional view of the cell press with the plate in the extended position with the second substrate in contact with the second tie layer.

With reference to FIG. 11, with the cell press 20 in the open position and the second substrate 72 supported by the plate 26 suspended from the table 24, the substrate 64, the tie layer 66 disposed on top of the substrate 64, the second tie layer 70 disposed on top of the tie layer 66, and the photovoltaic cell 23 disposed between the tie layer 66 and the substrate 70 are transferred into the cell press 20, e.g., from the curing oven 76 as shown in FIG. 9. As shown in FIG. 12, the first 52 and third 56 vacuum systems are used such that one of the second substrate 72 and the table 24 are then moved toward the other until the second substrate 72 contacts the second tie layer 70. A vacuum is applied between the second substrate 72 and the second tie layer 70 such that the space between the second substrate 72 and the second tie layer 70 is evacuated as the second substrate 72 contacts the second tie layer 70.

The invention has been described in an illustrative manner, and it is to be understood that the terminology which has been used is intended to be in the nature of words of description rather than of limitation. Obviously, many modifications and variations of the present invention are possible in light of the above teachings, and the invention may be practiced otherwise than as specifically described.

What is claimed is:

1. A method of forming a photovoltaic cell module including a photovoltaic cell with the use of a cell press having a table, a lid, and a plate pneumatically coupled to the lid between the lid and the table and moveable relative to the lid toward and away from the table, said method comprising:
    disposing the photovoltaic cell between the plate and the table;
    supporting the photovoltaic cell with the plate;
    applying a vacuum between the lid and the plate to space the photovoltaic cell and the plate from the table;
    introducing a substrate and a tie layer between the photovoltaic cell and the table with the substrate supported by the table and with the tie layer supported by the substrate between the substrate and the photovoltaic cell with a space between the photovoltaic cell and the tie layer;
    moving one of the photovoltaic cell and the table toward the other until the photovoltaic cell contacts the tie layer; and
    applying a vacuum between the photovoltaic cell and the tie layer such that the space between the photovoltaic cell and the tie layer is evacuated as the photovoltaic cell contacts the tie layer.

2. The method as set forth in claim 1 wherein moving one of the photovoltaic cell and table is further defined as moving one of the plate and the table toward the other.

3. The method as set forth in claim 1 wherein moving one of the photovoltaic cell and the table further comprises applying a vacuum between the plate and the table while applying the vacuum between the photovoltaic cell and the tie layer to move the plate toward the table.

4. The method as set forth in claim 1 wherein vacuum is applied between the lid and the plate before introducing the substrate and the tie layer between the photovoltaic cell and the table.

5. The method as set forth in claim 1 wherein the plate defines an aperture and wherein disposing the photovoltaic cell between the plate and the table is further defined as applying vacuum through the aperture between the aperture and the photovoltaic cell to pull the photovoltaic cell toward the plate.

6. The method as set forth in claim 1 further applying a vacuum between the plate and the table to move the plate toward the photovoltaic cell.

7. The method as set forth in claim 1 wherein the tie layer is further defined as an encapsulant and further comprising applying the encapsulant to the substrate by one of spray coating, flow coating, curtain coating, dip coating, extrusion coating, knife coating, screen coating, and stencil coating.

8. The method as set forth in claim 1 wherein the tie layer has a penetration of from 1.1 to 100 mm and a tack value of less than −0.6 g.sec.

9. The method as set forth in claim 1 further comprising removing the substrate, the tie layer, and the photovoltaic cell from the cell press and applying a second tie layer onto the photovoltaic cell and applying a second substrate onto the second tie layer.

10. The method as set forth in claim 1 the plate defines a plurality of apertures and wherein the photovoltaic cell is further defined as an array of photovoltaic cells and wherein supporting the photovoltaic cell is further defined as introducing the array of photovoltaic cells between the table and the plate with the photovoltaic cells aligned with the plurality of apertures of the plate.

11. The method as set forth in claim 4 further comprising relieving the vacuum between the lid and the plate after applying the vacuum between the plate and the table to allow the plate to move toward the table.

12. The method as set forth in claim 4 further comprising applying a vacuum between the lid and the plate after moving one of the photovoltaic cell and the table toward the other to move the plate away from the photovoltaic cell.

13. The method as set forth in claim 4 wherein the lid is moveable toward and away from the table and further comprising sealing the lid to the table prior to applying a vacuum between the photovoltaic cell and the tie layer.

14. The method as set forth in claim 5 further comprising moving one of the photovoltaic cell and the plate toward the other to pull the photovoltaic cell toward the plate when vacuum is applied through the aperture.

15. The method as set forth in claim 5 further comprising relieving the vacuum through the aperture of the plate after moving one of the photovoltaic cell and the table toward the other to release the photovoltaic cell from the plate.

16. The method as set forth in claim 15 further comprising moving one of the plate and the table away from the other after relieving the vacuum through the aperture of the plate.

17. The method as set forth in claim 16 wherein moving one of the plate and the table away from the other is further defined as applying a vacuum between the lid and the plate to move the plate toward the lid away from the table.

18. A method of forming a photovoltaic cell module including a photovoltaic cell with the use of a cell press having a table, a lid, and a plate that is pneumatically coupled to the lid and moveable relative to the lid toward and away from the table, the plate defining an aperture, said method comprising:
    disposing the photovoltaic cell between the plate and the table;
    moving one of the photovoltaic cell and the plate toward the other until the plate contacts the photovoltaic cell;
    applying a vacuum through the aperture between the aperture and the photovoltaic cell to pull the photovoltaic cell toward the plate;
    applying a vacuum between the lid and the plate to move the photovoltaic cell and the plate away from the table;
    introducing a substrate and a tie layer between the photovoltaic cell and the table with the substrate supported by the table and with the tie layer supported by the substrate between the substrate and the photovoltaic cell with a space between the photovoltaic cell and the tie layer;
    moving one of the photovoltaic cell and the table toward the other until the photovoltaic cell contacts the tie layer; and
    applying a vacuum between the photovoltaic cell and the tie layer such that the space between the photovoltaic cell and the tie layer is evacuated as the photovoltaic cell contacts the tie layer.

19. A cell press for forming a photovoltaic cell module, said cell press comprising:
    a table for supporting a substrate and a tie layer supported by the substrate;
    a plate spaced from said table;
    at least one of said table and said plate being moveable toward and away from the other;
    said plate being configured to suspend a photovoltaic cell spaced from said substrate and said tie layer to define a space between said photovoltaic cell and said tie layer;
    a lid pneumatically coupled to said plate defining a chamber between said lid and said plate and a first vacuum system in communication with said chamber for moving said plate relative to said lid;

wherein said plate defines an aperture and wherein a second vacuum system is in communication with said aperture for drawing vacuum through said aperture to suspend the photovoltaic cell; and a third vacuum system in communication with said space between the photovoltaic cell and the tie layer for evacuating the space between the photovoltaic cell and the tie layer as at least one of said table and said plate moves toward the other.

20. The cell press as set forth in claim 19 further comprising a seal extending from the lid to the plate to hermetically seal the chamber between the lid to the plate.

21. The cell press as set forth in claim 19 wherein said lid is configured to hermetically seal to the table.

22. The cell press as set forth in claim 19 further comprising a shuttle plate and stops extending from table for precisely positioning the shuttle plate on the table.

* * * * *